(12) United States Patent
Lai et al.

(10) Patent No.: US 8,610,250 B2
(45) Date of Patent: Dec. 17, 2013

(54) PACKAGING SUBSTRATE HAVING EMBEDDED CAPACITORS AND FABRICATION METHOD THEREOF

(75) Inventors: Chien-Kuang Lai, Taoyuan (TW); Chun-Chih Huang, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 0 days.

(21) Appl. No.: 13/458,059

(22) Filed: Apr. 27, 2012

(65) Prior Publication Data

US 2013/0105943 A1 May 2, 2013

(30) Foreign Application Priority Data

Nov. 1, 2011 (TW) .............................. 100139804 A

(51) Int. Cl.
*H01L 21/02* (2006.01)

(52) U.S. Cl.
USPC .................... 257/532; 257/686; 257/E21.008

(58) Field of Classification Search
USPC ................. 257/301, 528, 532, 534, 535, 536, 257/E27.048, E21.008, E21.499; 438/109, 438/253, 107

See application file for complete search history.

(56) References Cited

U.S. PATENT DOCUMENTS

| 5,237,204 A * | 8/1993 | Val ................................ 257/698 |
| 8,274,133 B2 * | 9/2012 | Chen et al. ..................... 257/528 |
| 2011/0018099 A1 * | 1/2011 | Muramatsu .................... 257/532 |

* cited by examiner

*Primary Examiner* — Chuong A Luu
*Assistant Examiner* — Nga Doan
(74) *Attorney, Agent, or Firm* — Edwards Wildman Palmer LLP; Peter F. Corless; Steven M. Jensen

(57) ABSTRACT

A packaging substrate includes: a substrate having a core layer, a cavity penetrating the core layer and circuit layers formed on surfaces of the core layer; a first capacitor disposed in the cavity; a bonding layer formed on the first capacitor in the cavity of the substrate; a second capacitor disposed on the bonding layer so as to be received in the cavity; and a dielectric layer formed on the substrate and in the cavity for covering the first and second capacitors. By stacking the first and second capacitors in the cavity through the bonding layer, the single core layer is embedded with two layers of the capacitors to thereby meet the multi-function requirement.

9 Claims, 4 Drawing Sheets

PACKAGING SUBSTRATE HAVING EMBEDDED CAPACITORS AND FABRICATION METHOD THEREOF

CROSS-REFERENCES TO RELATED APPLICATIONS

This application claims under 35 U.S.C. §119(a) the benefit of Taiwanese Application No. 100139804, filed Nov. 1, 2011, the entire contents of which is incorporated herein by reference.

BACKGROUND OF THE INVENTION

1. Field of the Invention

The present invention relates to packaging substrates and fabrication methods thereof, and more particularly, to a packaging substrate having embedded capacitors and a fabrication method thereof.

2. Description of Related Art

Along with the rapid development of semiconductor packaging technologies, different package types have been developed for semiconductor devices. To reduce the height of packages so as to meet the miniaturization or thinning requirement of products, semiconductor components are generally embedded in cavities of packaging substrates so as to reduce the volume of the overall semiconductor devices and improve the electrical performance.

FIGS. 1A to 1D are schematic cross-sectional views showing a fabrication method of a packaging substrate 1 having an embedded capacitor according to the prior art. Referring to FIG. 1A, a substrate 1a is provided, which has a core layer 10 having opposite first and second surfaces 10a, 10b, a cavity 100 in communication with the first and second surfaces 10a, 10b of the core layer 10 and a circuit layer 101 formed on the first and second surfaces 10a, 10b of the core layer 10. The core layer 10 further has a plurality of conductive through holes 102 formed therein for electrically connecting the circuit layer 101 on the first and second surfaces 10a, 10b.

Then, a capacitor 11 is disposed in the cavity 100. The capacitor 11 has electrode pads 110a, 110b disposed at left and right ends thereof, respectively.

Referring to FIG. 1B, a first dielectric material 14a is formed on the first surface 10a of the core layer 10, on an upper side of the capacitor 11 and in a portion of the cavity 100.

Referring to FIG. 1C, a second dielectric material (not shown) is pressed to the second surface 10b of the core layer 10, on a lower side of the capacitor 11 and in the cavity 100 so as to be combined with the first dielectric material 14a to form a dielectric layer 14, thereby securing in position the capacitor 11 in the dielectric layer 14.

Referring to FIG. 1D, a built-up structure 16 is formed on the dielectric layer 14 and electrically connecting the capacitor 11. The built-up structure 16 has a built-up dielectric layer 160, a built-up circuit layer 161 formed on the built-up dielectric layer 160 and a plurality of conductive vias 162 formed in the built-up dielectric layer 160 for electrically connecting the built-up circuit layer 161, the circuit layer 101 and the electrode pads 110a, 110b of the capacitor 11.

Thereafter, an insulating protection layer 17 is formed on the built-up structure 16 and has a plurality of openings 170 formed therein for exposing portions of the built-up structure 16.

However, limited by the area of the core layer 10 and the design of the circuit layer 101 and the built-up circuit layer 161, the single core layer 10 can only be embedded with one layer of the capacitor 11. Therefore, such a packaging substrate has limited functions and accordingly cannot meet the multi-function requirement.

On the other hand, in order to meet the multi-function requirement, several packaging substrates can be stacked on one another, which, however, leads to an increase in height of the overall structure. As such, the structure cannot meet the miniaturization or thinning requirement.

Therefore, there is a need to provide a packaging substrate having embedded capacitors and a fabrication method thereof so as to overcome the above-described drawbacks.

SUMMARY OF THE INVENTION

Accordingly, the present invention provides a packaging substrate having embedded capacitors, which comprises: a substrate having a core layer, at least a cavity penetrating the core layer and circuit layers formed on surfaces of the core layer; a first capacitor disposed in the at least a cavity and having first electrode pads disposed at two opposite ends thereof; a bonding layer formed on the first capacitor in the at least a cavity of the substrate; a second capacitor disposed on the bonding layer so as to be received in the cavity and having second electrode pads disposed at two opposite ends thereof; and a dielectric layer formed on the substrate and in the cavity for covering the first and second capacitors.

The present invention further provides a fabrication method of a packaging substrate having embedded capacitors, which comprises the steps of: providing a substrate having a core layer, at least a cavity penetrating the core layer and circuit layers formed on surfaces of the core layer; disposing a first capacitor in the at east a cavity of the substrate; forming a bonding layer on the first capacitor; disposing a second capacitor on the bonding layer so as for the first and second capacitors to be received in the at least a cavity of the substrate; and forming a dielectric layer on the substrate and in the at least a cavity for covering the first and second capacitors.

Therefore, by stacking the first and second capacitors in the cavity through the bonding layer, the single core layer is embedded with two stacked capacitors so as to increase combinational and selective functions of the capacitors, thereby meeting the multi-function requirement.

Furthermore, by eliminating the need to stack another packaging substrate having an embedded capacitor as required in the prior art, the present invention reduces the height of the overall structure to thereby meet the miniaturization or thinning requirement.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "one", "on", "top", "bottom" etc. are merely for illustrative purpose and should not be construed to limit the scope of the present invention.

FIGS. 2A to 2G are schematic cross-sectional views showing a fabrication method of a packaging substrate 2 having embedded capacitors according to the present invention.

Figure 1A:
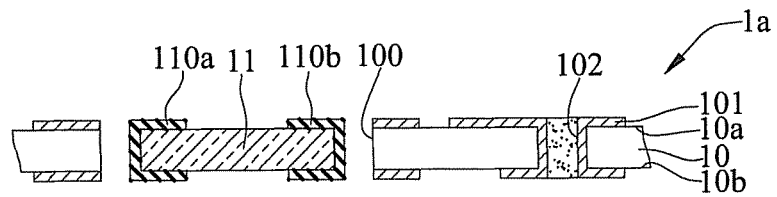
FIGS. 1A to 1D are schematic cross-sectional views showing a fabrication method of a packaging substrate having an embedded capacitor according to the prior art.
Figure 1B:
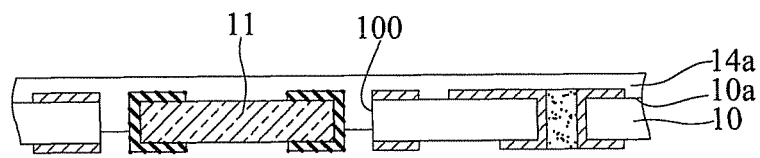
Figure 1C:
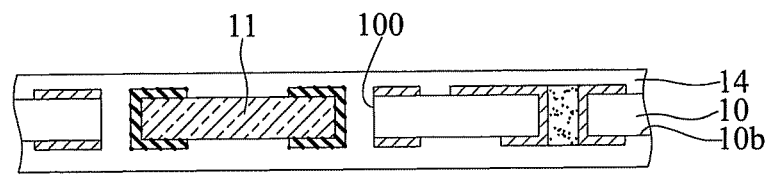
Figure 1D:
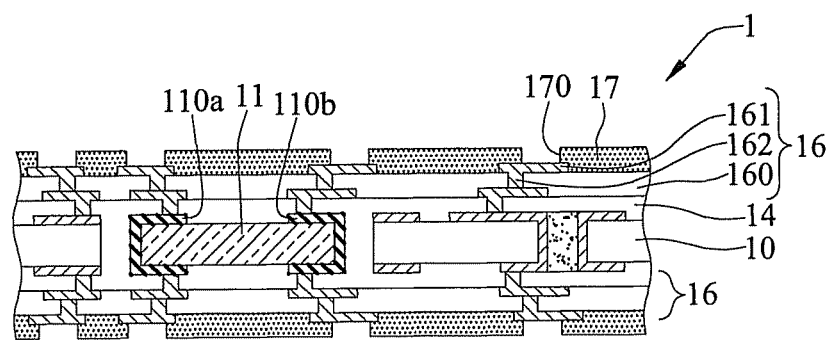
Figure 2A:
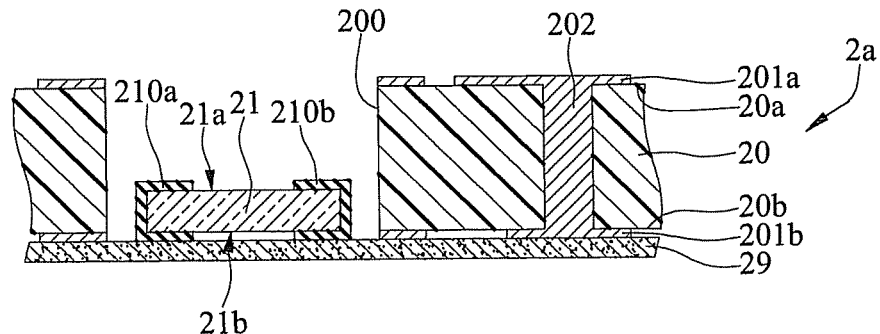
FIGS. 2A to 2G are schematic cross-sectional views showing a fabrication method of a packaging substrate having embedded capacitors according to the present invention, wherein FIG. 2F' shows another embodiment of FIG. 2F.

Referring to FIG. 2A, a substrate 2a is provided. The substrate 2a has a core layer 20 having opposite first and second surfaces 20a, 20b, a cavity 200 in communication with the first and second surfaces 20a, 20b of the core layer 20, and circuit layers 201a, 201b disposed on the first and second surfaces 20a, 20b, respectively. The core layer 20 further has a plurality of conductive through holes 202 formed therein for electrically connecting the circuit layers 201a, 201b on the first and second surfaces 20a, 20b.

Thereafter, a carrier 20 is attached to the second surface 20b of the core layer 20 for covering one end of the cavity 200. Then, a first capacitor 21 having an upper side 21a and a lower side 21b is disposed in the cavity 200 with its lower side 21b attached to the carrier 29. In the present embodiment, the first capacitor 21 has first electrode pads 210a, 210b disposed at left and right ends thereof and extending from the upper side 21a to the lower side 21b. But it should be noted that there is no special limitation on the structure of the first capacitor.

Figure 2B:
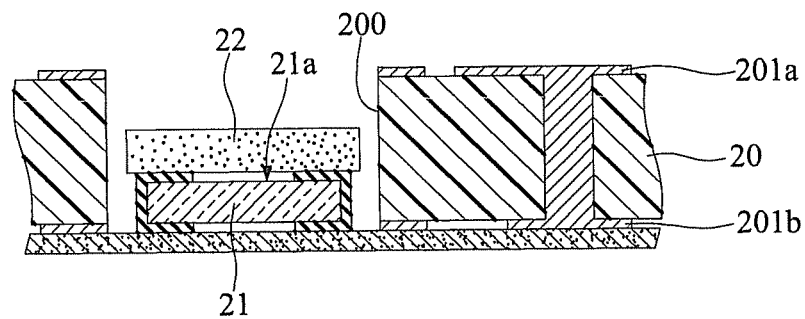

Referring to FIG. 2B, a bonding layer 22 is formed on the upper side 21a of the first capacitor 21. In the present embodiment, the bonding layer 22 is made of a dielectric material or an insulating material.

Figure 2C:
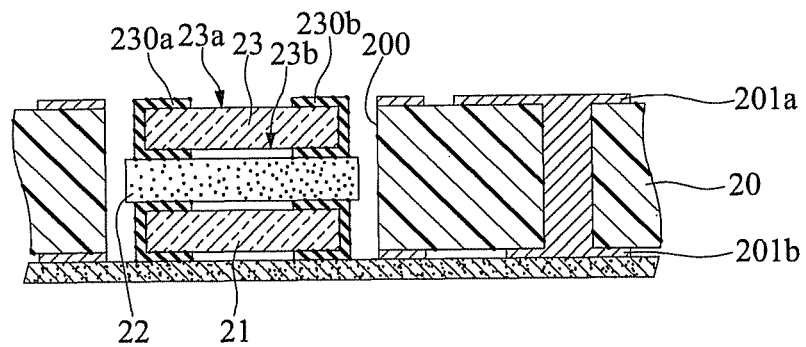

Referring to FIG. 2C, a second capacitor 23 having an upper side 23a and a lower side 23b is disposed on the bonding layer 22 via its lower side 23b such that both the first and second capacitors 21, 23 are received in the cavity 200. In the present embodiment, the second capacitor 23 has second electrode pads 230a, 230b disposed at left and right ends thereof and extending from the upper side 23a to the lower side 23b. But it should be noted that there is no special limitation on the structure of the second capacitor.

Figure 2D:
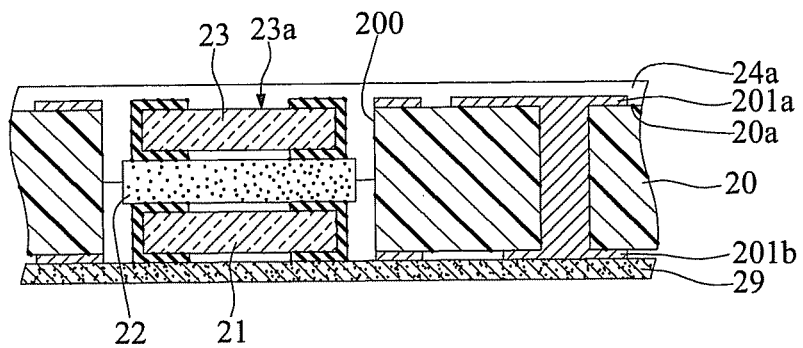

Referring to FIG. 2D, a first dielectric material 24a is formed on the second capacitor 23 at one end of the cavity 200. In the present embodiment, the first dielectric material 24a covers the first surface 20a of the core layer 20, the circuit layer 201a and the upper side 23a of the second capacitor 23. Further, the first dielectric material 24a extends between the left and right sides of the second capacitor 23 and the cavity 200 and between the left and right side surfaces of the bonding layer 22 and the cavity 200.

Figure 2E:
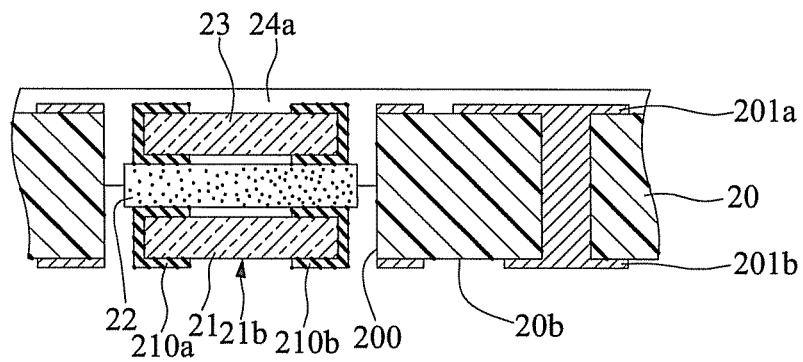

Referring to FIG. 2E, the carrier 29 is removed to expose the second surface 20b of the core layer 20, the lower side 21b of the first capacitor 21 and the first electrode pads 210a, 210b.

Figure 2F:
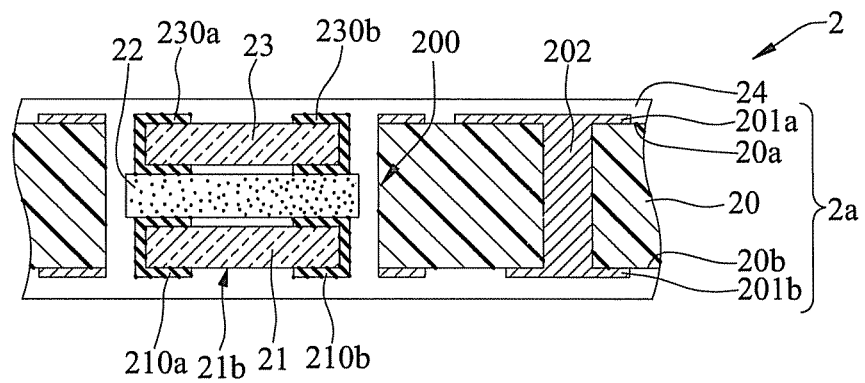
Figure 2F:
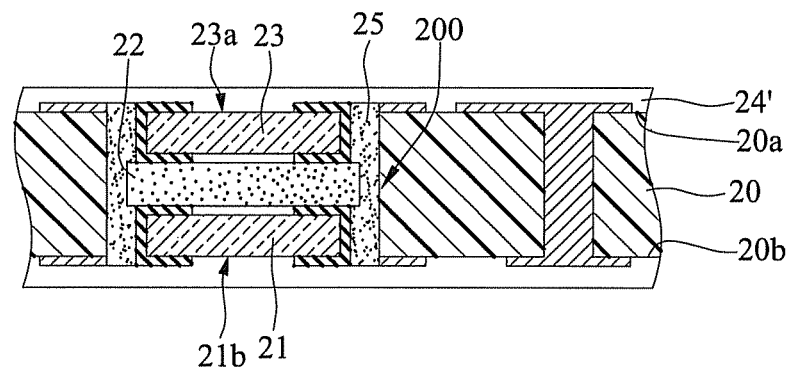

Referring to FIG. 2F, a second dielectric material (not shown) is pressed to the second surface 20b of the core layer 20, the lower side 21b of the first capacitor 21 and in the cavity 200 such that the second dielectric material is combined with the first dielectric material 24a to form a dielectric layer 24, thereby securing in position the first and second capacitors 21, 23 in the dielectric layer 24.

The dielectric layer 24 is formed on the first and second surfaces 20a, 20b of the core layer 20 to cover the first and second capacitors 21, 23 and extends between the first capacitor 21 and the cavity 200, between the second capacitor 23 and the cavity 200 and between the bonding layer 22 and the cavity 200.

In another embodiment, as shown in FIG. 2F', an adhesive material 25 is alternatively formed between the first capacitor 21 and the cavity 200, between the bonding layer 22 and the cavity 200, and between the second capacitor 23 and the cavity 200 for securing in position the first and second capacitors 21, 23. Then, a dielectric layer 24' is formed on the first and second surfaces 20a, 20b of the core layer 20, the lower side 21b of the first capacitor 21 and the upper side 23a of the second capacitor 23.

Figure 2G:
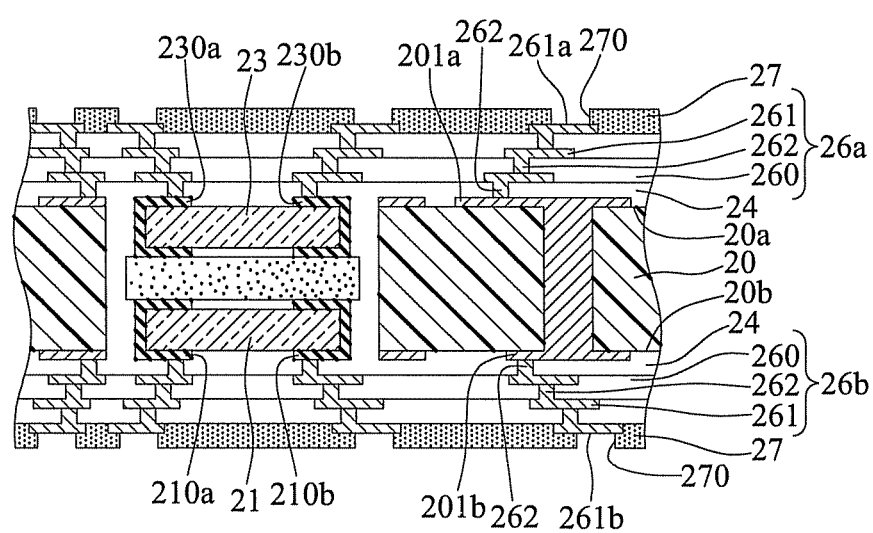

Subsequently, referring to FIG. 2G continued from FIG. 2F, built-up structures 26a, 26b are formed on the dielectric layer 24, i.e., above the first and second surfaces 20a, 20b of the core layer 20, and electrically connecting the first and second capacitors 21, 23. In the present embodiment, the built-up structures 26a, 26b each have a built-up dielectric layer 260, a built-up circuit layer 261 formed on the built-up dielectric layer 260, and a plurality of conductive vias 262 formed in the built-up dielectric layer 260 and electrically connecting the built-up circuit layer 261. Further, portions of the conductive vias 262 electrically connect the circuit layers 201a, 201b, the first electrode pads 210a, 210b of the first capacitor 21 and the second electrode pads 230a, 230b of the second capacitor 23.

Subsequently, an insulating protection layer 27 is formed on the built-up structures 26a, 26b and has a plurality of openings 270 for exposing portions of surfaces 261a, 261b of the outermost circuit layers 261 of the built-up structures 26a, 26b.

Therefore, by stacking the first and second capacitors 21, 23 in the cavity 200 through the bonding layer 22, the single core layer 20 is embedded with the two capacitors 21, 23, thereby increasing the combinational and selective functions of the capacitors and eliminating the limitation on the number and density of the embedded capacitors imposed by the area of the core layer and design of the circuit layer and the built-up circuit layer as in the prior art.

Further, the present invention meets the multi-function requirement without the need to stack another packaging substrate having an embedded capacitor as in the prior art, thus resulting in a reduction in height of the overall structure.

In addition, if the bonding layer 22 is made of a dielectric material, it can be combined with the dielectric layer 24 to achieve a preferred bonding force, thereby enhancing the fastening effect to the first and second capacitors 21, 23 and accordingly increasing the product reliability.

The present invention further provides a packaging substrate 2 having embedded capacitors. The package substrate 2 has: a substrate 2a having a core layer 20, a cavity 200 and circuit layers 201a, 201b; a first capacitor 21 disposed in the cavity 200; a bonding layer 22 formed on the first capacitor 21; a second capacitor 23 disposed on the bonding layer 22; and a dielectric layer 24 or 24' formed on the substrate 2a and in the cavity 200.

The core layer 20 of the substrate 2a has a first surface 20a and a second surface 20b opposite to the first surface 20a, and the cavity 200 is in communication with the first and second surfaces 20a, 20b. The core layer 20 further has a plurality of conductive through holes 202 for electrically connecting the circuit layers 201a, 201b.

The first capacitor 21 is received in the cavity 200 and has first electrode pads 210a, 210b disposed at left and right ends thereof.

The bonding layer 22 is formed in the cavity 200. The bonding layer 22 is made of a dielectric material or an insulating material.

The second capacitor 23 is received in the cavity 200 and has two second electrode pads 230a, 230b disposed at left and right ends thereof.

The dielectric layer 24 or 24' are formed on the first and second surfaces 20a, 20b of the core layer 20 and the circuit layers 201a, 201b for covering the first and second capacitors 21, 23. In an embodiment, the dielectric layer 24 is further formed between the first capacitor 21 and the cavity 200 and between the second capacitor 21 and the cavity 200 so as to securing in position the first and second capacitors 21, 23. In another embodiment, an adhesive material 25 is formed between the first capacitor 21 and the cavity 200 and between the second capacitor 23 and the cavity 200 for securing in position the first and second capacitors 21, 23.

The packaging substrate 2 further has built-up structures 26a, 26b formed on the dielectric layer 24 and electrically connecting the first and second capacitors 21, 23, and an insulating protection layer 27 formed on the built-up structures 26a, 26b and having a plurality of openings 270 formed therein for exposing portions of surfaces 261a, 261b of the built-up structures 26a, 26b.

According to the present invention, two capacitors are received in a cavity of a substrate through a bonding layer such that a single core layer is embedded with two capacitors, thereby meeting the multi-function requirement.

Further, by eliminating the need to stack another packaging substrate having an embedded capacitor as in the prior art, the present invention effectively reduces the height of the overall structure so as to meet the miniaturization requirement.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A packaging substrate having embedded capacitors, comprising:
   - a substrate having a core layer, at least a cavity penetrating the core layer and circuit layers formed on surfaces of the core layer;
   - a first capacitor disposed in the at least a cavity and having first electrode pads disposed at two opposite ends thereof;
   - a bonding layer formed on the first capacitor in the at least a cavity of the substrate;
   - a second capacitor disposed on the bonding layer so as to be received in the cavity and having second electrode pads disposed at two opposite ends thereof; and
   - a dielectric layer formed on the substrate and in the at least a cavity for covering the first and second capacitors.

2. The substrate of claim 1, wherein the core layer has a plurality of conductive through holes formed therein for electrically connecting the circuit layers.

3. The substrate of claim 1, wherein the core layer has opposite first and second surfaces so as for the cavity to be in communication therewith.

4. The substrate of claim 3, wherein the dielectric layer is formed on the first and second surfaces of the core layer.

5. The substrate of claim 1, wherein the bonding layer is made of a dielectric material or an insulating material.

6. The substrate of claim 1, wherein the dielectric layer is further formed between the first capacitor and the cavity and also between the second capacitor and the cavity for securing the first and second capacitors in position.

7. The substrate of claim 1, further comprising an adhesive layer formed between the first capacitor and the cavity and also between the second capacitor and the cavity for securing the first and second capacitors in position.

8. The substrate of claim 1, further comprising a built-up structure formed on the dielectric layer and electrically connecting the first and second capacitors.

9. The substrate of claim 8, further comprising an insulating protection layer formed on the built-up structure and having a plurality of openings formed therein for exposing portions of the built-up structure.

* * * * *